United States Patent [19]
Baumann et al.

[11] Patent Number: 5,369,060
[45] Date of Patent: Nov. 29, 1994

[54] METHOD FOR DICING COMPOSITE WAFERS

[75] Inventors: Helmut Baumann, Gomaringen; Juergen Kurle, Reutlingen; Peter Eiberger, Lichtenstein, all of Germany

[73] Assignee: Robert Bosch GmbH, Stuttgart, Germany

[21] Appl. No.: 70,141

[22] Filed: Jun. 1, 1993

[30] Foreign Application Priority Data

Jun. 20, 1992 [DE] Germany .............................. 4220284

[51] Int. Cl.$^5$ ........................................ H01L 21/302
[52] U.S. Cl. .............................. 437/226; 148/DIG. 28; 156/645; 83/51; 125/13.01
[58] Field of Search ...................... 437/226, 227; 148/DIG. 28; 257/108, 254, 415; 156/645; 51/283 R, 327; 83/876, 877, 51; 125/12, 13.01

[56] References Cited

U.S. PATENT DOCUMENTS

| | | | |
|---|---|---|---|
| 4,217,689 | 8/1980 | Fujii et al. | 29/583 |
| 4,814,296 | 3/1989 | Jedlicka et al. | 437/226 |
| 4,846,032 | 7/1989 | Jampathom et al. | 83/51 |
| 4,882,933 | 11/1989 | Petersen et al. | 73/517 |
| 4,961,821 | 10/1990 | Drake et al. | 156/647 |
| 4,985,982 | 1/1991 | Lohr et al. | 29/566.001 |
| 5,000,811 | 3/1991 | Campanelli | 156/264 |
| 5,095,349 | 3/1992 | Fujii et al. | 29/84 |
| 5,196,378 | 3/1993 | Bean et al. | 437/226 |
| 5,202,271 | 4/1993 | Kouzuma et al. | 437/3 |
| 5,219,796 | 6/1993 | Quinn et al. | 437/227 |

FOREIGN PATENT DOCUMENTS

| | | |
|---|---|---|
| 54-109375 | 8/1979 | Japan . |
| 2-112252 | 4/1990 | Japan . |
| 2-30060 | 9/1990 | Japan . |

OTHER PUBLICATIONS

Micro-Swiss, 1991, Gideon Levinson, "Principles of Dicing".

IEEE Transactions on Semiconductor Manufacturing, vol. 4, No. 1, Feb. 1991, Chang et al., "Hybrid Wafer-Dicing Process for GaAs MMIC Production".

Primary Examiner—George Fourson
Assistant Examiner—David M. Mason
Attorney, Agent, or Firm—Kenyon & Kenyon

[57] ABSTRACT

In a method for dicing multi-layer composite wafers, proceeding from an upper side of the wafer, cuts are introduced into an upper layer of the wafer and, proceeding from a lower side of the wafer, cuts are introduced into a lower layer of the wafer.

9 Claims, 1 Drawing Sheet

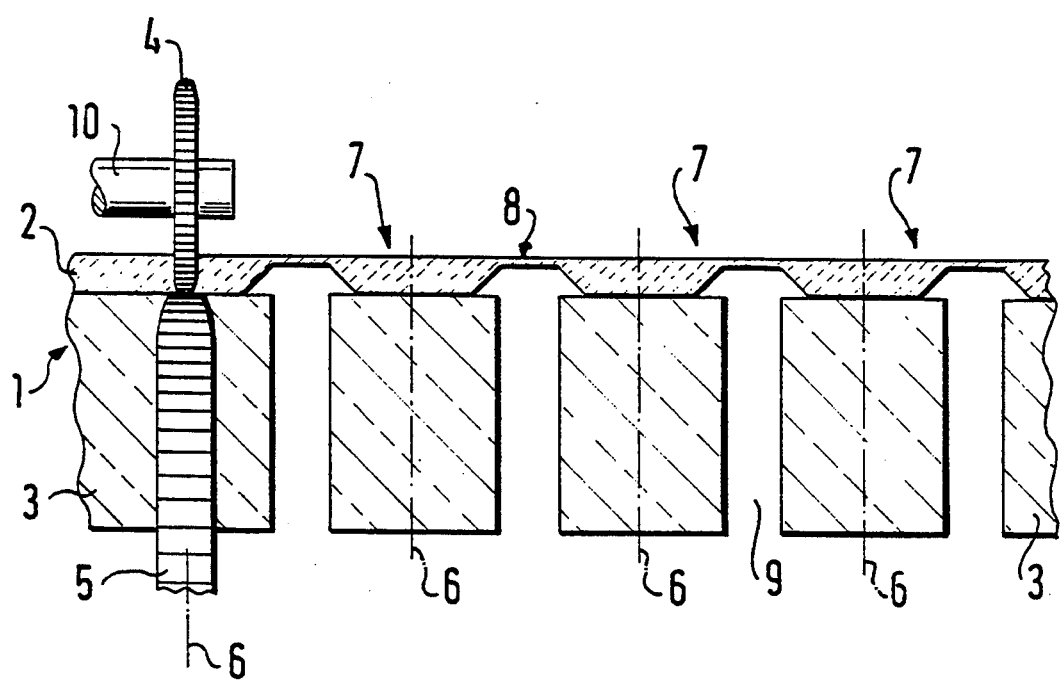

METHOD FOR DICING COMPOSITE WAFERS

FIELD OF THE INVENTION

The present invention relates to a method for dicing wafers and in particular to a method for dicing a composite wafer into a plurality of chips.

BACKGROUND OF THE INVENTION

It is generally known to divide wafers into individual chips by dicing. As a rule, this takes place without regard to the fact that wafers can be constructed out of various layers of different materials. It is also known, from the Micro-Swiss Company publication entitled "Principles of Dicing" by Gideon Levison, that sawing produces the highest quality cuts and that saw blades can be adapted to the material.

SUMMARY OF THE INVENTION

The present invention is directed to a method of dicing a composite wafer into a plurality of chips. In particular, a first layer of the wafer is cut in a first cutting process and a second layer of the wafer is cut in a second cutting process.

This dicing method can be adapted to the properties of the particular layer being cut. The dicing therefore takes place in a particularly careful manner for the individual chips. In addition, the time for the dicing and the wear on the tools used for the dicing can potentially be reduced due to the adapting of the dicing processes to the particular layers. Furthermore, dicing which proceeds from both sides of the composite wafer can lead to narrower dicing gaps. This results in an optimal utilization of the service of the wafer to obtain useful chips.

Sawing results in a particularly high quality of the cuts introduced. In this case, it is advisable to adapt the saw blades and the process parameters used to the specific material to be cut. Particularly high demands are placed on the dicing process if mechanical structures have been produced by etching in the silicon layer. The method according to the present invention can be quite advantageously used in the case of a combination of silicon and glass, the cutting of which can be particularly poor using conventional methods.

BRIEF DESCRIPTION OF THE DRAWING

The FIGURE illustrates the method of dicing a composite wafer according to the present invention.

DETAILED DESCRIPTION

In the FIGURE, there is shown a composite wafer 1 which includes an upper layer 2 of silicon and a lower layer 3 of glass. The two layers 2, 3 are connected by a so-called anodic bonding process in which the two layers 2, 3 are first cleaned, then placed in contact with one another and, finally, bonded to one another by means of a temperature treatment, so as to form the composite wafer 1.

The FIGURE also shows two saw blades 4, 5, the upper saw blade 4 cutting only the upper silicon layer 2 and the lower saw blade 5 cutting only the lower glass layer 3. The saw blades 4, 5 are configured as circular saw blades. For simplification purposes, the corresponding rotating drive shaft 10 is shown only for the upper saw blade 4. The saw blades 4, 5 are standard saw blades used for cutting these particular materials. As noted in the above-mentioned Micro-Swiss Company publication, saw blades having diamond particles can be used to cut glass and/or silicon. The structure of the individual saw blades, however, differs as a function of the particular materials being sawed. As a rule, for silicon, the diamond particles are arranged in a nickel matrix, while a plastic matrix is preferred for glass.

The thickness of a saw blade increases with the thickness of the layer to be cut through. This is necessary because a saw blade which is too thin relative to the cutting depth is unstable and, thus, the direction of cutting cannot be precisely maintained. Therefore, if the composite wafer is cut in one operation, the thickness of the saw blade must be adapted to the total thickness of the composite wafer. Thus, the method according to the present invention also reduces the cutting waste, i.e., the area required for the dicing. The silicon surface can, therefore, be optimally used for electronic and micromechanical structures.

The two cuts of the saw blades 4, 5 are carried out one after the other, but at the same (corresponding) places. The phrase "one after the other" is to be understood to mean that the saw blades 4, 5 are not used at the same place at the same time. For example, one side of the composite wafer 1 is glued onto a film. The other side of the composite wafer 1 is then sawed in a first sawing process. The composite wafer 1 is still connected. The film can therefore be easily removed. Another film is then glued onto the side which has already been sawed. Finally, the composite wafer 1 is cut into individual chips in a second sawing process.

The method of the present invention is particularly advantageous if the different layers are relatively thick, as is frequently the case for micromechanical structures, for instance. By way of example, the FIGURE shows a composite wafer 1 that is used for manufacturing micromechanical pressure sensors. The composite wafer 1 is cut, by dicing along the dashed dicing lines 6, into individual pressure-sensor chips 7. Each of the pressure-sensor chips 7 has a diaphragm 8 and a passage opening 9 in the glass for feeding pressure. The diaphragm 8 is structured out of the silicon layer 2 by anisotropic silicon etching methods. By means of drilling or another suitable technique, a passage opening 9 is introduced into the glass layer 3. The medium to be measured is guided through the opening 9 to the rear side of the diaphragm 8.

The diaphragm 8 is deformed as a result of a difference in pressure between the upper side and the lower side. This deformation of the diaphragm can be indicated by piezoresistive resistors located on the diaphragm 8.

As a rule, the glass layer 3 of the pressure-sensor chips 7 is clearly thicker than the silicon layer 2, in order to reduce mechanical stresses which can occur in the glass layer 3 between the silicon and a metallic support. The likelihood of a false measurement signal from the pressure sensor is thus reduced. It is difficult, as well as expensive, to cut composite wafers using conventional wafer dicing methods, as known, for instance, from semiconductor technology. Although two sawing processes are required with the method according to the present invention, the total process time can be reduced because a significantly higher cutting speed is used in sawing processes for only one material than for composite layers.

What is claimed is:

1. A method of dicing a composite wafer into a plurality of chips, wherein the wafer is formed of first and second layers of different materials, thereby defining an interface between the first and second layers, comprising the steps of:

making a first cut into the first layer at a first side of the wafer so that the first cut extends from the first side of the wafer to the interface between the first and second layers, the first layer being composed of a first material; and making a second cut into the second layer at a second side of the wafer so that the second cut extends from the second side of the wafer, through the second layer, to the interface between the first and second layers, the second layer being composed of a second material different than the first material.

2. The method according to claim 1, wherein the first and second cuts meet at a point on the interface between the first and second layers.

3. The method according to claim 1, wherein:
the first layer is an upper layer of the wafer;
the first side is an upper side of the wafer;
the second layer is a lower layer of the wafer; and
the second side is a lower side of the wafer.

4. The method according to claim 1, wherein the first material is silicon.

5. The method according to claim 1, wherein the second material is glass.

6. The method according to claim 2, wherein the first and second cuts are made by sawing.

7. The method according to claim 6, wherein the sawing of the first cut is performed by a first saw blade adapted to cut the first material, and the sawing of the second cut is performed by a second saw blade adapted to cut the second material.

8. The method according to claim 1, further comprising the step of etching at least one diaphragm out of the first layer.

9. The method according to claim 7, wherein the first material is silicon and the second material is glass and wherein the first saw blade includes diamond particles arranged in a nickel matrix and the second saw blade includes diamond particles arranged in a plastic matrix.

* * * * *